(12) United States Patent
Ishihara

(10) Patent No.: US 10,985,357 B2
(45) Date of Patent: Apr. 20, 2021

(54) BATTERY WIRING MODULE

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventor: Akio Ishihara, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 177 days.

(21) Appl. No.: 16/319,441

(22) PCT Filed: Jul. 6, 2017

(86) PCT No.: PCT/JP2017/024746
§ 371 (c)(1),
(2) Date: Jan. 21, 2019

(87) PCT Pub. No.: WO2018/020973
PCT Pub. Date: Feb. 1, 2018

(65) Prior Publication Data
US 2019/0245185 A1 Aug. 8, 2019

(30) Foreign Application Priority Data
Jul. 26, 2016 (JP) .............................. JP2016-145947

(51) Int. Cl.
*H01M 2/20* (2006.01)
*H01M 10/42* (2006.01)
(Continued)

(52) U.S. Cl.
CPC .......... *H01M 2/206* (2013.01); *G01R 31/364* (2019.01); *G01R 31/396* (2019.01);
(Continued)

(58) Field of Classification Search
CPC .. H01M 2/206; H01M 10/425; H01M 2/1077; H01M 10/482; H01M 10/486; H01M 2010/4271; H01M 2220/20
See application file for complete search history.

(56) References Cited

U.S. PATENT DOCUMENTS

| 2014/0335378 | A1 | 11/2014 | Kuroda |
| 2014/0342191 | A1* | 11/2014 | Shin ................... H01M 10/486 429/7 |
| 2015/0372354 | A1* | 12/2015 | Nakano ................... B60L 50/64 429/90 |

FOREIGN PATENT DOCUMENTS

| JP | 2002-117726 A | 4/2002 |
| JP | 2010-114189 A | 5/2010 |

(Continued)

OTHER PUBLICATIONS

International Search Report, Application No. PCT/JP2017/024746, dated Oct. 3, 2017.

*Primary Examiner* — Stewart A Fraser
(74) *Attorney, Agent, or Firm* — Honigman LLP

(57) ABSTRACT

In a battery wiring module that is attached to a unit cell group, a configuration that can inhibit noise propagation to signal lines is implemented in a more compact manner. A battery wiring module is attached to a unit cell group in which a plurality of unit cells are aligned. The battery wiring module includes: a wiring pattern configured as a signal transmission path on one side of a board main body portion; and a guard pattern that is formed in the vicinity of the wiring pattern on the one side of the board main body portion, and is kept at a predetermined reference potential while being insulated from the wiring pattern.

8 Claims, 5 Drawing Sheets

(51) Int. Cl.
*H01M 2/10* (2006.01)
*H01M 10/48* (2006.01)
*G01R 31/396* (2019.01)
*G01R 31/364* (2019.01)
*H05K 1/02* (2006.01)
*H05K 1/18* (2006.01)

(52) U.S. Cl.
CPC ....... *H01M 2/1077* (2013.01); *H01M 10/425* (2013.01); *H01M 10/482* (2013.01); *H01M 10/486* (2013.01); *H05K 1/02* (2013.01); *H05K 1/189* (2013.01); *H01M 2010/4271* (2013.01); *H01M 2220/20* (2013.01)

(56) References Cited

FOREIGN PATENT DOCUMENTS

| | | |
|---|---|---|
| JP | 2011-227000 A | 11/2011 |
| JP | 2013-109914 A | 6/2013 |
| JP | 2013-125612 A | 6/2013 |
| JP | 2015-106536 A | 6/2015 |
| WO | 2012-011237 A1 | 1/2012 |

* cited by examiner

US 10,985,357 B2

BATTERY WIRING MODULE

CROSS-REFERENCE TO RELATED APPLICATIONS

This application is the U.S. national stage of PCT/JP2017/024746 filed Jul. 6, 2017, which claims priority of Japanese Patent Application No. JP 2016-145947 filed Jul. 26, 2016.

TECHNICAL FIELD

The present disclosure relates to a battery wiring module.

BACKGROUND

In electric vehicle or hybrid vehicles, a battery module is mounted in which a plurality of unit cells, each including a positive electrode terminal and a negative electrode terminal, are arranged, and the electrode terminals of adjacent unit cells are connected using a connection member such as a bus bar.

For example, JP 2011-124176A discloses a battery module in which a battery connection assembly is attached to a unit cell group that includes a plurality of unit cells that are connected in series. A plurality of wires (voltage detection lines) are electrically connected to the unit cell group, and the battery connection assembly includes a housing portion (voltage detection line housing portion) that holds the plurality of voltage detection lines.

In the battery module disclosed in JP 2011-124176A, the voltage detection lines are configured as independent wires, and the voltage detection lines are routed and held in a groove-shaped housing portion (voltage detection line housing portion) formed in the battery connection assembly. Accordingly, at least due to this portion, the size of the battery module may be increased.

There is also another problem in that, when signal lines (voltage detection lines or the like) are provided, the signal accuracy decreases due to the propagation of external noise to the signal line. As a measure to address this problem, wires that have shielding properties may be used as the signal lines, but the use of such wires leads to a further increase in size.

The present disclosure has been made under the circumstances described above, and it is an object of the present disclosure to provide a battery wiring module that is attached to a unit cell group, wherein a configuration that can inhibit the propagation of noise to signal lines is implemented in a more compact manner.

SUMMARY

A battery wiring module that is an example of the present disclosure is a battery wiring module that is attached to a unit cell group in which a plurality of unit cells, each including a positive electrode terminal and a negative electrode terminal, are aligned, the battery wiring module including: a board main body portion that is attached to the unit cell group; a wiring pattern that is formed on at least one side of the board main body portion, and is configured as a signal transmission path; and a guard pattern that is formed in the vicinity of the wiring pattern on the one side of the board main body portion, and is kept at a predetermined reference potential while being insulated from the wiring pattern.

ADVANTAGEOUS EFFECTS OF DISCLOSURE

The battery wiring module described above includes a board main body portion that is attached to a unit cell group. On one side of the board main body portion, a wiring pattern that is configured as a signal transmission path and a guard pattern that is formed in the vicinity of the wiring pattern and is kept at a predetermined reference potential while being insulated from the wiring pattern are provided. Because the wiring pattern is formed on one side of the board main body portion, it is possible to secure a signal transmission path in a compact manner. In addition, because the guard pattern is formed in the vicinity of the wiring pattern on the board main body portion, it is possible to inhibit the propagation of noise to the wiring pattern (signal lines), with a compact configuration.

DETAILED DESCRIPTION OF PREFERRED EMBODIMENTS

Figure 1:
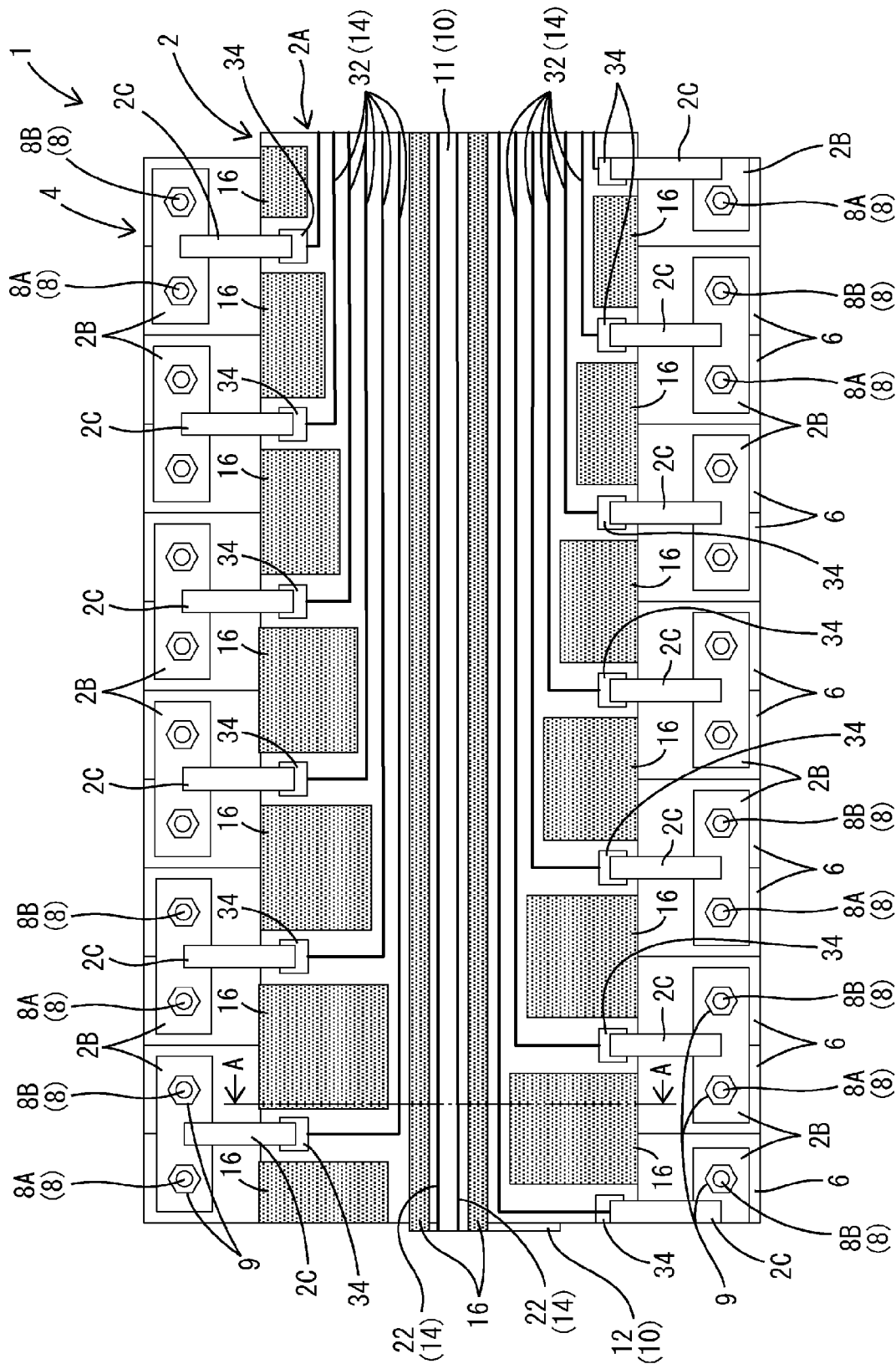
FIG. 1 is a plan view schematically showing a battery module of Example 1 in which a battery wiring module is combined with a unit cell group.

A desirable example of the present disclosure will now be described. It should be noted however that the present disclosure is not limited to the example given below.

In the battery wiring module, the guard pattern may be formed between a plurality of the wiring patterns on the one side of the board main body portion.

With the above-described battery wiring module, the propagation of noise between wiring patterns can be inhibited by the guard pattern formed between the plurality of wiring patterns.

In the battery wiring module, a voltage detection pattern that transmits a voltage signal that corresponds to a voltage of an electrode of each unit cell and a temperature detection pattern that transmits a temperature signal that corresponds to a temperature of the unit cells may be formed on the one side of the board main body portion as the wiring pattern. Also, the guard pattern may be formed between the voltage detection pattern and the temperature detection pattern on the one side of the board main body portion.

With the battery wiring module described above, a path for transmitting a voltage signal and a path for transmitting a temperature signal can be secured in a compact manner. Furthermore, noise propagation (for example, propagation of noise from the voltage detection pattern, which is likely to conduct external noise, to the temperature detection pattern) can be effectively inhibited by the guard pattern formed between the voltage detection pattern and the temperature detection pattern.

The plurality of unit cells may be aligned in a predetermined front-rear direction, and a temperature sensor may be mounted on the one side of the board main body portion at one end of the board main body portion in the front-rear direction. Also, the temperature detection pattern that transmits a signal from the temperature sensor may be formed on the one side of the board main body portion so as to extend from one end to the other end of the board main body portion in the front-rear direction. Furthermore, on the one side of the board main body portion, regions on both sides in a right-left direction of a first forming region in which the temperature detection pattern is formed may be defined as second forming regions in which the voltage detection pattern is formed. Also, on the one side of the board main body portion, the guard pattern that extends from one end to the other end of the board main body portion in the front-rear direction may be formed at positions between the first forming region and each of the second forming regions that are on right and left sides of the first forming region.

In the battery wiring module described above, in the case where it is desired that the temperature sensor is disposed at one end of the board main body portion in the front-rear direction and the temperature detection pattern is disposed so as to extend from one end to the other end in the front-rear direction, voltage detection patterns can be efficiently disposed using the right and left side regions of the temperature detection pattern. Furthermore, in the battery wiring module described above, guard patterns are formed between a region (first forming region) in which the temperature detection pattern is formed and each region (each second forming region) in which the voltage detection pattern is formed, and it is therefore possible to more reliably inhibit the propagation of noise between the first forming region and each second forming region.

In the battery wiring module, a plurality of individual detection patterns that are electrically connected to the unit cell group at a plurality of positions and individually transmit voltage signals corresponding to voltages at the positions to which the individual detection patterns are connected may be formed on the one side of the board main body portion as the wiring pattern. The guard pattern may be disposed between adjacent individual detection patterns of at least a portion of the plurality of individual detection patterns.

With the battery wiring module described above, paths that transmit voltage signals corresponding to the voltages at a plurality of positions on the unit cell group can be secured in a compact manner as the plurality of voltage detection patterns. Furthermore, with the battery wiring module described above, the propagation of noise between adjacent individual detection patterns can be inhibited, and thus the individual detection patterns can transmit voltage signals with high accuracy.

The board main body portion may include: a first main body portion that at least partially covers a first outer surface portion of the unit cell group on which the electrode terminals are provided; and a second main body portion that is configured such that the second main body portion is connected to the first main body portion and is bent relative to the first main body portion, and at least partially covers a second outer surface portion of the unit cell group. Also, a sensor portion that generates a signal may be mounted on the second main body portion of the board main body portion, and the wiring pattern that transmits the signal from the sensor portion may be formed so as to straddle the first main body portion and the second main body portion. Furthermore, the guard pattern may be formed in the vicinity of the wiring pattern in each of the first main body portion and the second main body portion.

In the battery wiring module described above, the first main body portion is provided so as to cover the first outer surface portion of the unit cell group, and thus wiring related to the electrode terminals can be disposed efficiently using the first main body portion. On the other hand, the second main body portion is provided so as to cover the second outer surface portion of the unit cell group, and the sensor portion is mounted on the second main body portion. Accordingly, this configuration is advantageous in the case where it is desired that the sensor portion is disposed on the second outer surface portion side (a side that is different from the side on which the electrode terminals are provided). Furthermore, the guard pattern is also formed on the second main body portion that is bent from the first main body portion, and it is therefore possible to effectively inhibit the propagation of external noise in the vicinity of the sensor portion.

In the battery wiring module, a plurality of the guard patterns may be separately formed at a plurality of positions on the one side of the board main body portion. The plurality of the guard patterns may be electrically connected to each other via a conductor layer that is formed on the other side of the board main body portion.

As described above, by separately disposing the plurality of guard patterns on one side of the board main body portion, spatial restrictions can be easily dealt with, and a large region can be easily secured by efficiently disposing the guard patterns. Because the guard patterns that are separately disposed are electrically connected to each other via the conductor layer formed on the other side, the guard patterns that are separately disposed are likely to be kept at the same reference potential in a stable manner.

A circuit board portion in which the wiring pattern and the guard pattern are formed on the board main body portion may be configured as a flexible printed circuit board.

As described above, when the circuit board portion is configured as a flexible printed circuit board, the overall weight of the battery wiring module can be reduced, and the degree of freedom in the shape of the board and the positioning of the board can be further enhanced.

Example 1

Hereinafter, a description will be given of Example 1 in which the present disclosure is implemented.

Battery Module

A battery wiring module 2 of Example 1 is configured as a portion of a battery module 1 shown in FIG. 1. The battery module 1 is used as a power source for driving a vehicle such as, for example, an electric vehicle or a hybrid vehicle. The battery module 1 includes a unit cell group 4 in which a plurality of unit cells 6 are arranged in a predetermined direction, and a battery wiring module 2 that is attached to the unit cell group 4.

In the description given below, in the unit cell group 4, the direction in which the plurality of unit cells 6 are arranged is defined as the front-rear direction. One of the directions that is perpendicular to the front-rear direction is defined as the up-down direction, and a direction that is perpendicular to the front-rear direction and the up-down direction is defined as the right-left direction. In the example shown in FIG. 1, the up-down direction of FIG. 1 is the right-left direction of the unit cell group 4, and the right-left direction of FIG. 1 is the front-rear direction of the unit cell group 4. In FIG. 1, a direction perpendicular to the paper plane is the up-down direction of the unit cell group 4.

Unit Cell Group

Figure 2:
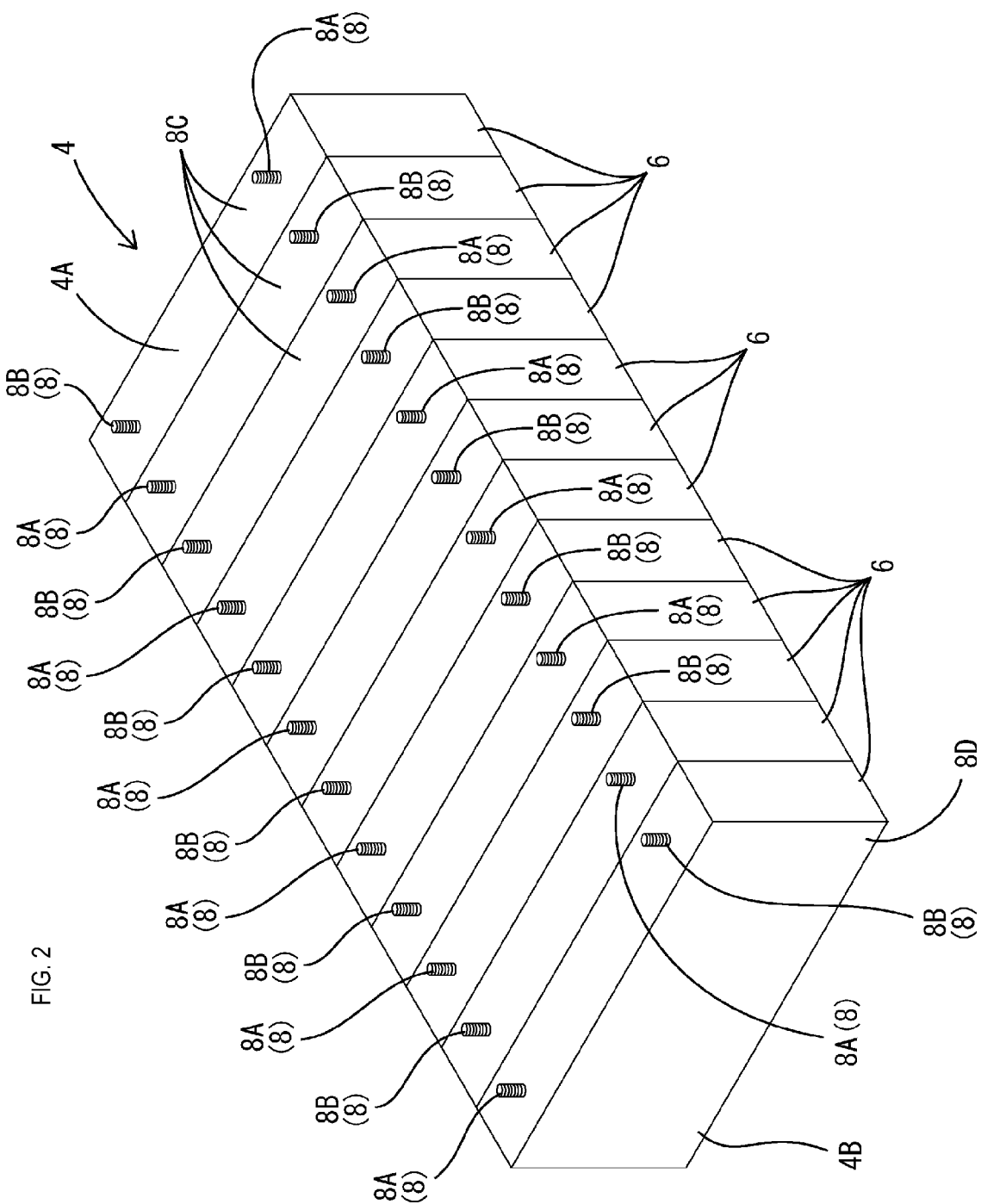
FIG. 2 is a simplified perspective view of the unit cell group that constitutes a portion of the battery module shown in FIG. 1.

As shown in FIG. 2, the unit cell group 4 is configured such that a plurality of unit cells 6, each including positive and negative electrode terminals 8, are arranged. Each unit cell 6 includes a rectangular parallelepiped main body portion in which a power generation element (not shown) is housed, and a pair of electrode terminals 8 that are provided at opposing right and left ends on a predetermined surface (upper surface) of the main body portion so as to protrude and extend upward. One of the pair of electrode terminals 8 is a positive electrode terminal 8A, and the other electrode terminal is a negative electrode terminal 8B. The circumferential surface of each electrode terminal 8 is threaded.

In the unit cell group 4, the unit cells 6 are aligned in the front-rear direction such that adjacent unit cells 6 are the reverse of each other in the right-left direction and electrode terminals 8 of different polarities are adjacent (a positive electrode and a negative electrode are alternately disposed in the arrangement direction). The electrode terminals 8 of adjacent unit cells 6 are electrically connected to each other with a bus bar 2B.

Battery Wiring Module

As shown in FIG. 1, the battery wiring module 2 is attached to the upper surface of the unit cell group 4. The battery wiring module 2 is a circuit structure that is attached to the unit cell group 4, and includes: a circuit board portion 2A that is disposed so as to partially cover the unit cell group 4; a plurality of bus bars 2B that connect the electrode terminals of the unit cells 6; and a plurality of connection members 2C that connect the bus bars 2B to the circuit board portion 2A.

Figure 3:
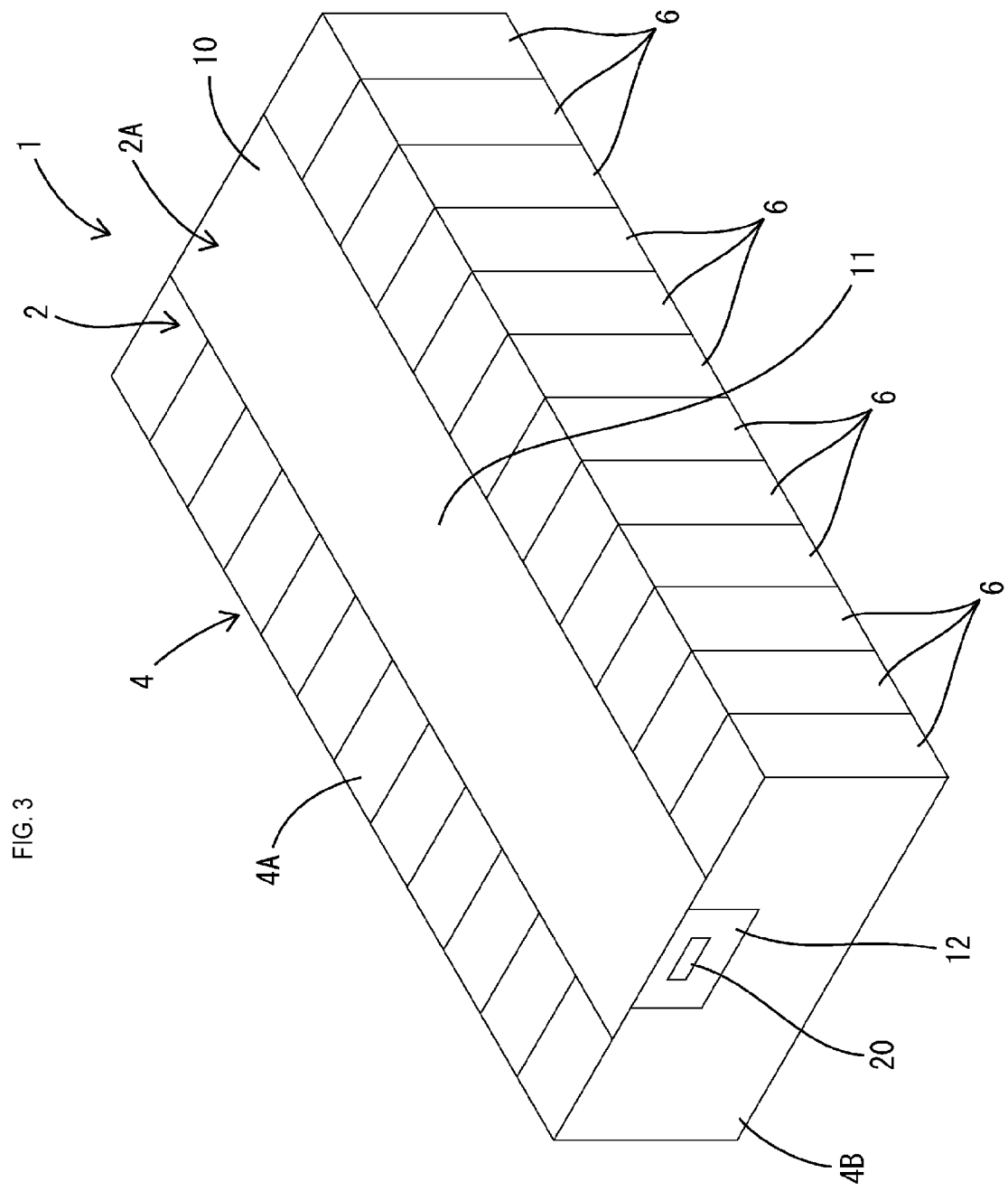
FIG. 3 is a perspective view conceptually showing an example in which the battery wiring module is attached to the unit cell group by being bent in the battery module shown in FIG. 1.
Figure 5:
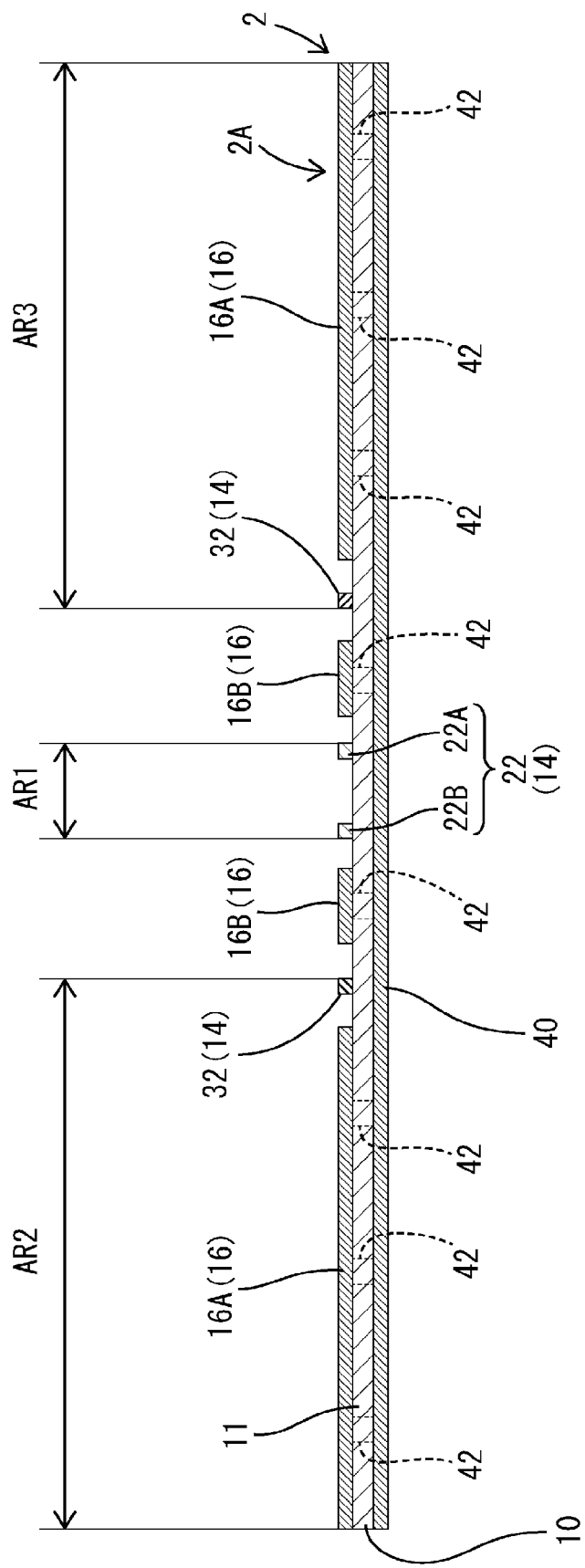
FIG. 5 is a schematic cross sectional view schematically showing the battery wiring module of Example 1, taken along the line A-A shown in FIG. 1.

As shown in FIGS. 3 and 5, the circuit board portion 2A includes a board main body portion 10, mounted components (a temperature sensor 20 and the like) that are mounted on the board main body portion 10, and conductive layers (a wiring pattern 14, a guard pattern 16, a back surface conductor layer 40, and the like) that are formed on the board main body portion 10.

The circuit board portion 2A is configured as a flexible printed circuit board. On one side (upper surface side) of the board main body portion 10, wiring patterns 14, guard patterns 16, lands 34, and the like are formed as a conduction path. Also, components such as a temperature sensor 20 and the like are mounted. Details of the circuit board portion 2A will be given later.

The bus bars 2B shown in FIG. 1 are fixed to the electrode terminals 8 using nuts 9 screwed onto the threads formed on the electrode terminals 8. In the example shown in FIG. 1, a plurality of unit cells 6 are connected in series by arranging the unit cells 6 such that adjacent electrode terminals 8 have different polarities, and the positive electrode terminal 8A and the negative electrode terminal 8B of adjacent unit cells 6 are connected using a bus bar 2B. As the metal that constitutes the bus bars 2B, any metal such as copper, a copper alloy, aluminum, an aluminum alloy, or stainless steel can be appropriately selected as needed. A plating layer that is made of a metal such as tin, nickel, or zinc selected as needed may be formed on the surface of each bus bar 2B.

As shown in FIG. 1, the battery wiring module 2 includes a plurality of connection members 2C. The connection members 2C are made of a metal material such as, copper, a copper alloy, aluminum, an aluminum alloy, or stainless steel, and function as voltage detection metal terminals. Each connection member 2C is configured as a path that electrically connects a wiring pattern 14 (specifically, a voltage detection pattern 32) formed on the circuit board portion 2A and a bus bar 2B, with one end thereof connected to the bus bar 2B and the other end connected to a land 34 formed on the circuit board portion 2A. Each connection member 2C is connected to a bus bar 2B by a known method such as welding, soldering, or fastening using bolts, and is also connected to a land 34 by a known method such as soldering.

Circuit Board Portion

A detailed description of the circuit board portion 2A will now be given.

In the circuit board portion 2A shown in FIG. 1 and FIGS. 3 to 5, the board main body portion 10 is configured as an insulating base film made of, for example, a polyimide film or a liquid crystal film, and is flexurally deformable or bendable. The board main body portion 10 is configured as a resin board portion on the flexible printed circuit board.

In this configuration, the term "one side" of the board main body portion 10 refers to the side (surface side) opposite to a surface of the board main body portion 10 that opposes the unit cell group 4, and the term "the other side" of the board main body portion 10 refers to the side (back side) of the surface of the board main body portion 10 that opposes the unit cell group 4.

As shown in FIGS. 1 and 3, the board main body portion 10 includes a first main body portion 11 that is provided on the upper surface side of the unit cell group 4, and a second main body portion 12 that is provided on the front surface side of the unit cell group 4. In the example shown in FIG. 2, an outer surface portion (upper surface portion) of the unit cell group 4 on which the electrode terminals 8 are provided is defined as a first outer surface portion 4A. As shown in FIG. 3, the first main body portion 11 is disposed so as to partially cover the first outer surface portion 4A. Likewise, in the example shown in FIG. 2, an outer surface portion (front surface portion) that is one longitudinal end of the unit cell group 4 is defined as a second outer surface portion 4B of the unit cell group 4. As shown in FIG. 3, the second main body portion 12 is disposed connected to the first main body portion 11 and bent at a substantially right angle relative to the first main body portion 11 so as to partially cover the second outer surface portion 4B.

Figure 4:
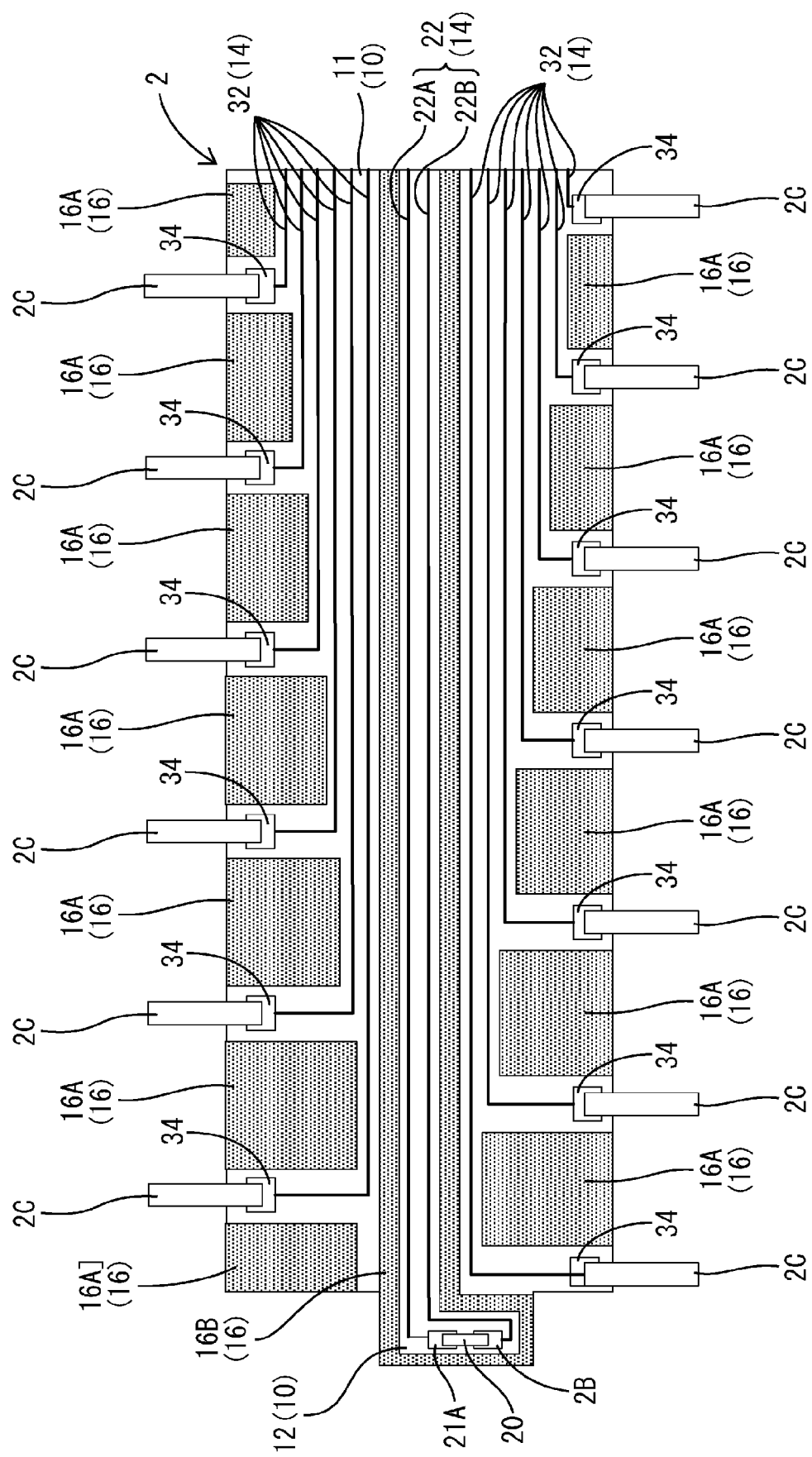
FIG. 4 is a schematic plan view mainly showing a circuit board portion that is included in the battery module shown in FIG. 1.

FIG. 4 partially and conceptually shows the battery wiring module 2, in which the second main body portion 12 disposed in a bent state as shown in FIG. 3 is in a straightened out state (in a state in which the second main body portion 12 is extended rather than being bent). However, in the actual product, the second main body portion 12 is disposed in a bent state as shown in FIG. 3. There is no particular limitation on the structure for fixing the second main body portion 12 in a bent state to the unit cell group 4. The second main body portion 12 may be fixed to the unit cell group 4 using a connecting member (not shown), or may be fixed using an adhesive medium or the like. Also, in FIG. 3, the placement of the circuit board portion 2A with respect to the unit cell group 4 is shown in a conceptual and simplified manner, and the illustration of some components such as bus bars 2B and connection members 2C is omitted.

The mount components that are mounted on the board main body portion 10 may be any component such as an electronic component or a connector, as long as they can be mounted on the board main body portion 10. In this configuration, the temperature sensor 20 shown in FIGS. 3 and 4 and the like are mounted as the mount components. In the configuration shown in FIG. 3, a plurality of unit cells 6 are aligned in the front-rear direction such that their thickness direction matches the front-rear direction, and the temperature sensor 20 is mounted on one end side in the front-rear direction of one side of the board main body portion 10 (the side opposite to the surface of the board main body portion 10 that opposes the unit cell group 4). The temperature sensor 20 is configured as, for example, a thermistor. As shown in FIG. 3, the temperature sensor 20 is mounted on one side (surface side, or in other words, the front side) of the second main body portion 12 formed near one longitudinal end (front end) of the board main body portion 10. As shown in FIG. 4, the temperature sensor 20 is attached to lands 21A and 21B that are formed on the second main body portion 12 by a known method such as, for example, soldering.

As shown in FIGS. 4 and 5, on one side (the surface opposite to the surface that opposes the unit cell group 4) of the board main body portion 10, surface-side conductor wiring layers such as a wiring pattern 14 and a guard pattern 16 are formed using a known print wiring technique. On the other side (the back surface that opposes the unit cell group 4) of the board main body portion 10, a back surface conductor layer 40 is formed so as to cover most of the other side (back surface) of the board main body portion 10. The surface of each conductive layer such as the wiring patterns 14, the guard patterns 16, and the conductor layer 40 may be covered with, for example, a protective film (for example, a polyimide film), or the like.

The wiring patterns 14 are configured as paths for transmitting a signal. As shown in FIGS. 4 and 5, the wiring patterns 14 are configured as a temperature detection pattern 22 or a voltage detection pattern 32.

The temperature detection pattern 22 is a pattern that transmits a temperature signal according to the temperature of the unit cells 6. Specifically, the temperature detection pattern 22 is configured as a conductive wiring layer that is a conduction path that transmits a signal from the temperature sensor 20 and is formed on one side (surface) of the board main body portion 10. As shown in FIG. 4, the temperature detection pattern 22 includes: a first conductive pattern 22A that is electrically connected to one terminal of the temperature sensor 20 configured as a thermistor via a land 21A; and a second conductive pattern 22B that is electrically connected to the other terminal of the temperature sensor 20 via a land 21B. Voltages applied to the first conductive pattern 22A and the second conductive pattern 22B are used to provide a signal that corresponds to the temperature of the temperature sensor 20 (a signal based on which the temperature of the temperature sensor 20 can be specified). For example, the temperature at the position of the temperature sensor 20 can be specified based on the potential difference between the first conductive pattern 22A and the second conductive pattern 22B.

As shown in FIGS. 4 and 5, the temperature detection pattern 22 (the first conductive pattern 22A and the second conductive pattern 22B) is formed on one side (surface side) of the board main body portion 10 so as to extend from one end (specifically, the front end) to the other end (specifically, the rear end) of the board main body portion 10 in the front-rear direction. More specifically, as shown in FIG. 4, the temperature sensor 20 is mounted on the second main body portion 12 of the board main body portion 10, and the temperature detection pattern 22 (the first conductive pattern 22A and the second conductive pattern 22B) that transmits a signal from the temperature sensor 20 is formed so as to straddle the first main body portion 11 and the second main body portion 12.

A plurality of voltage detection patterns 32 shown in FIG. 4 function as individual detection patterns that are electrically connected to the unit cell group 4 at a plurality of positions and individually transmit voltage signals corresponding to the voltages at the positions to which they are connected. Specifically, each voltage detection pattern 32 (each individual detection pattern) is electrically connected to a corresponding one of the electrodes in the unit cell group 4 shown in FIG. 1, and transmits a voltage signal corresponding to the voltage of the electrode to which it is connected. The voltage of the electrode terminal connected to each voltage detection pattern 32 may be applied directly to the voltage detection pattern 32, or the voltage of each electrode terminal may be divided and applied to each voltage detection pattern 32.

The guard patterns 16 shown in FIGS. 4 and 5 and the like are configured as patterns that inhibit the propogation of external noise to a wiring pattern 14. As shown in FIGS. 4 and 5, a guard pattern 16 is configured as a pattern that is formed in the vicinity of a wiring pattern 14 on one side (surface side) of the board main body portion 10, and is kept at a predetermined reference potential while being insulated from the wiring pattern 14. Specifically, the guard patterns 16 serve as a ground conduction path that is kept at the ground potential (0 V), and are electrically connected to a ground portion (not shown) in the vehicle.

As shown in FIGS. 4 and 5, in the battery wiring module 2, a guard pattern 16 is formed between a plurality of wiring patterns 14 on one side (surface side) of the board main body portion 10. For example, a first guard pattern 16A is formed between adjacent voltage detection patterns of a portion of the plurality of voltage detection patterns 32 while being insulated from the adjacent voltage detection patterns 32.

Specifically, as shown in FIG. 1, in the unit cell group 4 in which a plurality of unit cells 6 are connected in series, each bus bar 2B is provided so as to connect the positive electrode terminal 8A and the negative electrode terminal 8B of adjacent unit cells 6, and each bus bar 2B is electrically connected to a land 34 formed on the board main body portion 10 via a connection member 2C.

A plurality of lands 34 are aligned in each of a left end side region and a right end side region of the board main body portion 10. The lands 34 that are aligned in the left end side region of the board main body portion 10 are individually connected to the bus bars 2B (FIG. 1) that are disposed on the left side. Likewise, the lands 34 that are aligned on the right end side region of the board main body portion 10 are individually connected to the bus bars 2B that are disposed on the right side. In this configuration, the right side of the battery module 1 when the battery module 1 is viewed from the front side is defined as the "right side", and the left side of the battery module 1 when the battery module 1 is viewed from the front side is defined as the "left side".

In the left end side region (left half region) of the board main body portion 10, a first guard pattern 16A is formed between adjacent ones (lands 34 that are adjacent in the front-rear direction) of the plurality of lands 34 that are aligned on the left end side of the board main body portion 10. Likewise, in the right end side region of the board main body portion 10, a first guard pattern 16A is formed between adjacent ones (lands 34 that are adjacent in the front-rear direction) of the plurality of lands 34 that are aligned on the right end side of the board main body portion 10. Each of a plurality of first guard patterns 16A that is disposed between adjacent lands is formed so as to be partially surrounded by two voltage detection patterns 32 (individual wiring patterns) extending from the lands 34 that are adjacent in the front-rear direction. The first guard patterns 16A function to inhibit the propogation of external noise to the voltage detection patterns (for example, function to inhibit the propagation of noise between the voltage detection patterns 32).

In the battery wiring module 2, a second guard pattern 16B is also formed between a voltage detection pattern 32 and a temperature detection pattern 22 while being insulated from the voltage detection pattern 32 and the temperature detection pattern 22. In the example shown in FIG. 4, in each of the first main body portion 11 and the second main body portion 12, a second guard pattern 16B is formed in the vicinity of the temperature detection pattern 22, and the second guard pattern 16B is formed continuously so as to straddle the first main body portion 11 and the second main body portion 12.

As shown in FIG. 5 on one side (surface side) of the board main body portion 10, second forming regions AR2 and AR3 in each of which a voltage detection pattern 32 is formed are provided respectively on both sides in the right-left direction of a first forming region AR1 in which a temperature detection pattern 22 is formed. Also, on one side (surface side) of the board main body portion 10, second guard patterns 16B are formed so as to extend from one end to the other end of the board main body portion 10 in the front-rear direction at positions between the first forming region AR1 and each of the second forming regions AR2 and AR3 that are on the right and left sides of the first forming region AR1.

Specifically, a first conductive pattern 22A extends linearly from the front end portion to the rear end portion of the board main body portion 10 in the front-rear direction. At a position slightly removed from the first conductive pattern 22A, a second guard pattern 16B is formed so as to extend along the first conductive pattern 22A in the front-rear direction between the first forming region AR1 and the second forming region AR3. Likewise, a second conductive pattern 22B extends linearly from the front end portion to the rear end portion of the board main body portion 10 in the front-rear direction. At a position slightly removed from the second conductive pattern 22B, a second guard pattern 16B is formed so as to extend along the second conductive pattern 22B in the front-rear direction between the first forming region AR1 and the second forming region AR2. Only the temperature detection pattern 22 is provided between the two second guard patterns 16B extending in the front-rear direction. The right and left sides of the temperature detection pattern 22 are surrounded by the second guard pattern 16B, and no voltage detection pattern 32 is provided between the two second guard patterns 16B extending in the front-rear direction.

Also, in the example shown in FIGS. 4 and 5, a plurality of guard patterns 16 (a plurality of first guard patterns 16A and a plurality of second guard patterns 16B) are formed at a plurality of positions on one side (surface side) of the board main body portion 10. On the other hand, on the other side (back side) of the board main body portion 10, a conductor layer 40 is formed over a large area so as to straddle the plurality of guard patterns 16, and the plurality of guard patterns 16 are electrically connected to each other via the conductor layer 40. Specifically, as shown in FIG. 5, through holes 42 are formed in the board main body portion 10 at positions between each of the plurality of guard patterns 16 and the conductor layer 40. The plurality of guard patterns 16 are electrically connected to the conductor layer 40 via a conductive material present within the through holes 42 that are formed adjoining the guard patterns 16.

Although not shown in FIG. 1 and other diagrams, a component (not shown) other than the temperature sensor 20 may be attached to the circuit board portion 2A. For example, a connector housing made of a synthetic resin or the like may be attached at a rearward position on one side (surface) of the board main body portion 10. Also, a connector terminal that is electrically connected to each wiring pattern 14 may also be provided within the connector housing. In this case, the connector housing may be configured to be able to engage with a mating connector (not shown). The mating connector may be connected to, for example, an ECU (not shown) via a wire harness (not shown). The example described here is merely an example. For example, a detection apparatus (for example, a control apparatus such as a microcomputer) that acquires a signal from each wiring pattern 14 (voltage detection pattern 32 and temperature detection pattern 22), or a circuit that performs some form of control or operation (for example, a protective operation, or the like) based on the signal from each wiring pattern 14 may be provided in the board main body portion 10, or a board portion that is formed as a unitary unit with the battery wiring module 2.

Advantageous effects of the battery wiring module 2 of this configuration will be described.

The battery wiring module 2 of this configuration includes a board main body portion 10 that is attached to a unit cell group 4. On one side (surface side) of the board main body portion 10, a wiring pattern 14 that is configured as a signal transmission path, and a guard pattern 16 that is formed in the vicinity of the wiring pattern 14 and is kept at a predetermined reference potential while being insulated from the wiring pattern 14 are provided. Because the wiring pattern 14 is formed on one side (surface side) of the board main body portion 10, it is possible to secure a signal transmission path in a more compact manner as compared with a configuration in which larger wires or the like are used. In addition, because the guard pattern 16 is formed in the vicinity of the wiring pattern 14 on the board main body portion 10, it is possible to inhibit the propagation of noise to the wiring pattern 14 (signal lines), with a compact configuration.

With the battery wiring module 2 of this configuration, each guard pattern 16 is formed between a plurality of wiring patterns 14 on one side (surface side) of the board main body portion 10. With this configuration, noise propagation between wiring patterns is inhibited by the guard pattern 16 formed between the plurality of wiring patterns 14.

With the battery wiring module 2 of this configuration, on one side (surface side) of the board main body portion 10, a voltage detection pattern 32 that transmits a voltage signal that corresponds to the voltage of an electrode of a unit cell 6 and a temperature detection pattern 22 that transmits a temperature signal that corresponds to the temperature of the unit cell 6 are formed as wiring patterns 14. Also, on one side (surface side) of the board main body portion 10, a guard pattern 16 is formed between the voltage detection pattern 32 and the temperature detection pattern 22. With the battery wiring module 2, a path for transmitting a voltage signal and a path for transmitting a temperature signal can be secured in a compact manner. Furthermore, noise propagation (for example, propagation of noise from the voltage detection pattern 32, which is likely to conduct external noise, to the temperature detection pattern 22) can be effectively inhibited by the guard pattern 16 formed between the voltage detection pattern 32 and the temperature detection pattern 22.

In the battery module 1 shown in FIG. 1, a plurality of unit cells 6 are arranged in the front-rear direction, and a temperature sensor 20 is mounted on one side of the board main body portion 10 and at one end of the board main body portion 10 in the front-rear direction. Also, on one side (surface side) of the board main body portion 10, a temperature detection pattern 22 that transmits a signal from the temperature sensor 20 is formed so as to extend from one end to the other end of the board main body portion 10 in the front-rear direction. Furthermore, on one side (surface side) of the board main body portion 10, second forming regions AR2 and AR3 in each of which a voltage detection pattern 32 is formed are provided on both sides in the right-left direction of a first forming region AR1 in which the temperature detection pattern 22 is formed. On one side (surface side) of the board main body portion 10, guard patterns 16 (second guard patterns 16B) are formed so as to extend from one end (front end) to the other end (rear end) of the board main body portion 10 in the front-rear direction at positions between the first forming region AR1 and each of the second forming regions AR2 and AR3 on the right and left sides. In the battery wiring module 2 configured as described above, in the case where it is desired that the temperature sensor 20 is disposed at one end of the board main body portion 10 in the front-rear direction and the temperature detection pattern 22 is disposed so as to extend from one end to the other end in the front-rear direction, voltage detection patterns 32 can be efficiently disposed using the right and left side regions of the temperature detection pattern 22. Furthermore, in the battery wiring module 2, guard patterns 16 are formed between a region (first forming region AR1) in which the temperature detection pattern 22 is formed and each region (each second forming region AR2 and AR3) in which the voltage detection pattern 32 is formed, and it is therefore possible to more reliably inhibit the propagation of noise between the first forming region AR1 and each of the second forming regions AR2 and AR3.

In the battery wiring module 2 of this configuration, on one side (surface side) of the board main body portion 10, a plurality of voltage detection patterns 32 (individual detection patterns), which are electrically connected to the unit cell group 4 at a plurality of positions and individually transmit voltage signals corresponding to the voltages at the positions to which they are connected, are formed as a wiring pattern 14. Also, a guard pattern 16 (first guard pattern 16A) is disposed between adjacent voltage detection patterns of at least a portion of the plurality of voltage detection patterns 32 (individual detection patterns). With the battery wiring module 2 configured as described above, paths that transmit voltage signals corresponding to the voltages at a plurality of positions on the unit cell group 4 can be secured in a compact manner as the plurality of voltage detection patterns 32 (individual detection patterns). Furthermore, with the battery wiring module 2, noise propagation between adjacent voltage detection patterns 32 (individual detection patterns) can be inhibited, and thus the voltage detection patterns 32 (individual detection patterns) can transmit voltage signals with high accuracy.

The board main body portion 10 includes: a first main body portion 11 that at least partially covers a first outer surface portion 4A of the unit cell group 4 on which the electrode terminals 8 are provided; and a second main body portion 12 that is configured such that the second main body portion 12 is connected to the first main body portion 11 and is bent relative to the first main body portion 11, and at least partially covers a second outer surface portion 4B of the unit cell group 4. Also, in the second main body portion 12, a temperature sensor 20 (sensor portion) that generates a signal is mounted, and the temperature detection pattern 22 (wiring pattern) that transmits the signal from the temperature sensor 20 (sensor portion) is formed so as to straddle the first main body portion 11 and the second main body portion 12. Furthermore, in each of the first main body portion 11 and the second main body portion 12, the guard pattern 16 is formed in the vicinity of the temperature detection pattern 22 (wiring pattern). In the battery wiring module 2 configured as described above, the first main body portion 11 is provided so as to cover the first outer surface portion 4A of the unit cell group 4, and thus wiring related to the electrode terminals 8 can be disposed efficiently using the first main body portion 11. On the other hand, the second main body portion 12 is provided so as to cover the second outer surface portion 4B of the unit cell group 4, and the temperature sensor 20 (sensor portion) is mounted on the second main body portion 12. Accordingly, this configuration is advantageous in the case where it is desired that the temperature sensor 20 (sensor portion) is disposed on the second outer surface portion 4B side (a side that is different from the side on which the electrode terminals 8 are provided). Furthermore, the guard pattern 16 is also formed on the second main body portion 12 that is bent from the first main body portion 11, and it is therefore possible to effectively inhibit the propagation of external noise in the vicinity of the temperature sensor 20 (sensor portion).

In the battery wiring module 2 of this configuration, a plurality of guard patterns 16 are separately formed at a plurality of positions on one side (surface side) of the board main body portion 10. The plurality of guard patterns 16 are electrically connected to each other via a conductor layer 40 that is formed on the other side (back side) of the board main body portion 10. As described above, by separately disposing the plurality of guard patterns 16 on one side (surface side) of the board main body portion 10, spatial restrictions can be easily dealt with, and a large region can be easily secured by efficiently disposing the guard patterns 16. Because the guard patterns 16 that are separately disposed are electrically connected to each other via the conductor layer 40 formed on the other side (back side), the guard patterns 16 that are separately disposed are likely to be kept at the same reference potential in a stable manner.

The board main body portion 10 may be configured as a flexible printed circuit board. When the board main body portion 10 is configured as a flexible printed circuit board, the overall weight of the battery wiring module 2 can be reduced, and the degree of freedom in the shape of the board and the positioning of the board can be further enhanced.

Other Embodiments

The present disclosure is not limited to the example described in the foregoing description with reference to the drawings. For example, the following examples are also encompassed within the technical scope of the present disclosure.

The unit cell group 4 shown in Example 1 is merely an example, and thus the number of unit cells 6 can be set to any number as needed. Also, the type of unit cells 6 that constitute the unit cell group 4 is not specifically limited, and any known secondary battery or the like can be used.

In Example 1, as an example, a structure has been shown in which the board main body portion 10 is attached to the unit cell group via other members (a plurality of connection members 2C and a plurality of bus bars 2B). However, the board main body portion 10 may be fixed directly to the unit cell group 4. For example, the board main body portion 10 and the unit cell group 4 may be held unitarily by a holding member (not shown).

In Example 1, an example has been shown in which the wiring pattern 14 is provided only on one side (the upper surface side that does not oppose the unit cell group 4) of the board main body portion 10. However, the wiring pattern 14 may be provided on the other side (the lower surface side that opposes the unit cell group 4). In this case, a guard pattern that is similar to the guard pattern 16 may be provided in the vicinity of the wiring pattern 14 on the other side.

In Example 1, an example has been shown in which the temperature sensor 20 is used as the sensor portion that is mounted on the board main body portion 10. However, the present disclosure is not limited to this example. For example, a sensor portion that can detect an electric current, voltage or the like may be mounted on the board main body portion 10. Alternatively, a sensor that can detect the state of charge, the remaining capacity, discharge performance or the like may be mounted on the board main body portion 10.

In Example 1, an example has been shown in which the circuit board portion 2A is configured as a flexible printed circuit board. However, the circuit board portion 2A may be a known board (for example, a resin board configured as a rigid board) other than the flexible printed circuit board.

In Example 1, an example has been shown in which the second main body portion 12 is disposed on the front surface side of the unit cell group 4. However, the second main body portion 12 may be disposed so as to be bent on the rear surface side or a side surface side of the unit cell group 4.

The invention claimed is:

1. A battery wiring module that is attached to a unit cell group in which a plurality of unit cells, each including a positive electrode terminal and a negative electrode terminal, are aligned, the battery wiring module comprising:
   a board main body portion that is attached to the unit cell group;
   a wiring pattern that is formed on at least one side of the board main body portion, and is configured as a signal transmission path; and
   a guard pattern surrounding at least a portion of the wiring pattern on the one side of the board main body portion, the guard pattern spaced apart from and free of the wiring pattern, and is kept at a predetermined reference potential while being insulated from the wiring pattern, the guard pattern inhibiting a propagation of a noise to the wiring pattern.

2. The battery wiring module according to claim 1, wherein the guard pattern is formed between a plurality of the wiring patterns on the one side of the board main body portion.

3. The battery wiring module according to claim 1, wherein a voltage detection pattern that transmits a voltage signal that corresponds to a voltage of an electrode of each unit cell and a temperature detection pattern that transmits a temperature signal that corresponds to a temperature of the unit cells are formed on the one side of the board main body portion as the wiring pattern, and the guard pattern is formed between the voltage detection pattern and the temperature detection pattern on the one side of the board main body portion.

4. The battery wiring module according to claim 3,
   wherein the plurality of unit cells are aligned in a predetermined front-rear direction,
   a temperature sensor is mounted on the one side of the board main body portion at one end of the board main body portion in the front-rear direction,
   the temperature detection pattern that transmits a signal from the temperature sensor is formed on the one side of the board main body portion so as to extend from one end to the other end of the board main body portion in the front-rear direction,
   on the one side of the board main body portion, regions on both sides in a right-left direction of a first forming region in which the temperature detection pattern is formed are defined as second forming regions in which the voltage detection pattern is formed, and
   on the one side of the board main body portion, the guard pattern that extends from one end to the other end of the board main body portion in the front-rear direction is formed at positions between the first forming region and each of the second forming regions that are on right and left sides of the first forming region.

5. The battery wiring module according to claim 4,
   wherein a plurality of individual detection patterns that are electrically connected to the unit cell group at a plurality of positions and individually transmit voltage signals corresponding to voltages at the positions to which the individual detection patterns are connected are formed on the one side of the board main body portion as the wiring pattern, and
   the guard pattern is disposed between adjacent individual detection patterns of at least a portion of the plurality of individual detection patterns.

6. The battery wiring module according to claim 1,
   wherein the board main body portion includes: a first main body portion that at least partially covers a first outer surface portion of the unit cell group on which the electrode terminals are provided; and a second main body portion that is configured such that the second main body portion is connected to the first main body portion and is bent relative to the first main body portion, and at least partially covers a second outer surface portion of the unit cell group,
   a sensor portion that generates a signal is mounted on the second main body portion of the board main body portion,
   the wiring pattern that transmits the signal from the sensor portion is formed so as to straddle the first main body portion and the second main body portion, and
   the guard pattern surrounding at least a portion of and spaced apart and free of the wiring pattern in each of the first main body portion and the second main body.

7. The battery wiring module according to claim 1, wherein a plurality of the guard patterns are separately formed at a plurality of positions on the one side of the board main body portion, and the plurality of the guard patterns are electrically connected to each other via a conductor layer that is formed on the other side of the board main body portion.

8. The battery wiring module according to claim 1, wherein a circuit board portion in which the wiring pattern and the guard pattern are formed on the board main body portion is configured as a flexible printed circuit board.

* * * * *